US011101202B2

(12) United States Patent
Koyama

(10) Patent No.: US 11,101,202 B2
(45) Date of Patent: Aug. 24, 2021

(54) LEAD PIN AND WIRING BOARD HAVING LEAD PIN

(71) Applicant: SHINKO ELECTRIC INDUSTRIES CO., LTD., Nagano (JP)

(72) Inventor: Naomichi Koyama, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/891,350

(22) Filed: Jun. 3, 2020

(65) Prior Publication Data

US 2020/0395277 A1  Dec. 17, 2020

(30) Foreign Application Priority Data

Jun. 12, 2019 (JP) ............................. JP2019-109834

(51) Int. Cl.
*H01L 23/498* (2006.01)
*H01R 13/03* (2006.01)

(52) U.S. Cl.
CPC ........ *H01L 23/49811* (2013.01); *H01R 13/03* (2013.01); *H05K 2201/10318* (2013.01)

(58) Field of Classification Search
CPC ......... H01L 23/49811; H01L 23/49855; H01L 21/4853; H01R 13/03; H01R 13/02; H05K 3/3426; H05K 2201/10318; Y10T 428/12694; C25D 5/02
See application file for complete search history.

(56) References Cited

U.S. PATENT DOCUMENTS

| | | | | |
|---|---|---|---|---|
| 4,518,112 A | * | 5/1985 | Miller | B23K 35/001 228/124.1 |
| 5,780,172 A | * | 7/1998 | Fister | H01R 13/03 439/887 |
| 5,816,868 A | * | 10/1998 | Legrady | H05K 3/3426 439/876 |
| 5,916,695 A | * | 6/1999 | Fister | B32B 15/01 428/646 |
| 6,049,039 A | * | 4/2000 | Fushimi | H01R 4/028 174/267 |
| 6,300,678 B1 | * | 10/2001 | Suehiro | H01L 23/49811 257/697 |
| 6,518,518 B1 | * | 2/2003 | Saiki | B23K 35/262 174/267 |
| 6,583,366 B2 | | 6/2003 | Saiki | |

(Continued)

FOREIGN PATENT DOCUMENTS

| | | |
|---|---|---|
| JP | H02-034798 | 2/1990 |
| JP | 2001-358277 | 12/2001 |
| JP | 2009-076853 | 4/2009 |

*Primary Examiner* — Roshn K Varghese
(74) *Attorney, Agent, or Firm* — IPUSA, PLLC

(57) ABSTRACT

A lead pin includes a shaft portion, a head portion formed on one end of the shaft portion, and having a diameter greater than a diameter of the shaft portion, a tin-based first plated layer exposed at a surface of the head portion visible from the other end of the shaft portion, and a second plated layer exposed at an end surface of the shaft portion visible from the other end of the shaft portion. The second plated layer has a reflectivity with respect to visible light and a conductivity higher than a reflectivity with respect to the visible light and a conductivity of the first plated layer, respectively.

20 Claims, 11 Drawing Sheets

(56) References Cited

U.S. PATENT DOCUMENTS

| | | | |
|---|---|---|---|
| 7,291,791 B2* | 11/2007 | Saiki | B23K 35/262 |
| | | | 174/267 |
| 7,747,321 B2* | 6/2010 | Fischbach | A61N 1/3754 |
| | | | 607/36 |
| 8,153,900 B2 | 4/2012 | Takeuchi et al. | |
| 2001/0015491 A1* | 8/2001 | Shiraishi | H01L 23/49811 |
| | | | 257/697 |
| 2016/0276769 A1* | 9/2016 | Pscherer | H01R 13/03 |

\* cited by examiner

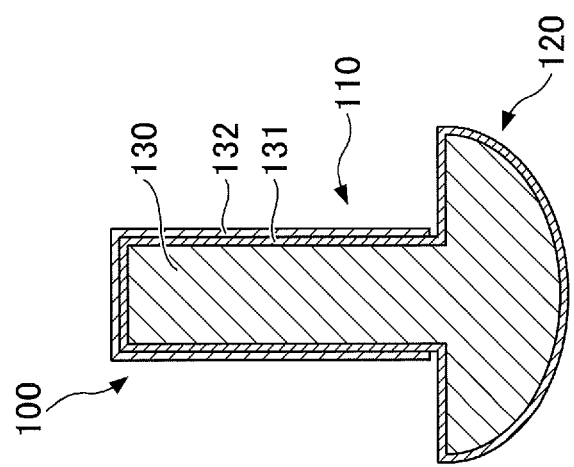
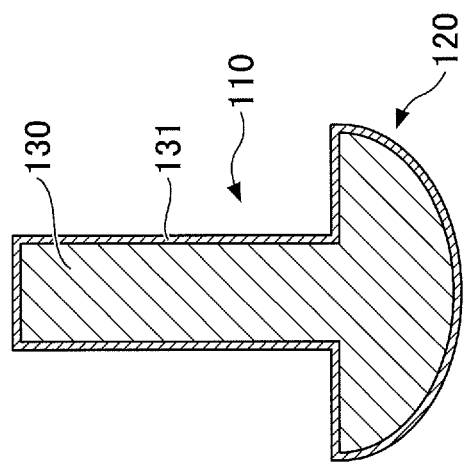
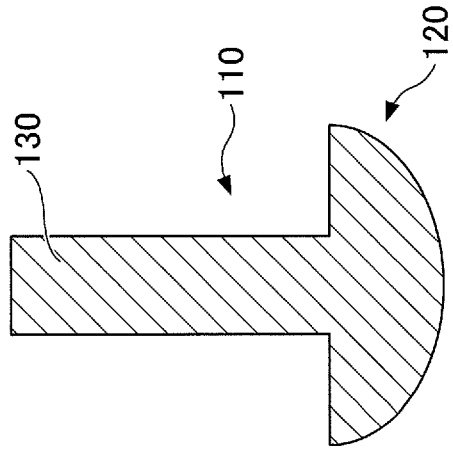

LEAD PIN AND WIRING BOARD HAVING LEAD PIN

CROSS-REFERENCE TO RELATED APPLICATION

This application is based upon and claims priority to Japanese Patent Application No. 2019-109834, filed on Jun. 12, 2019, the entire contents of which are incorporated herein by reference.

FIELD

Certain aspects of the embodiments discussed herein are related to a lead pin, and a wiring board having the lead pin.

BACKGROUND

Known wiring boards include a wiring board with lead pins. The lead pin includes a shaft portion, and a head portion provided at one end of the shaft portion. A surface portion of the lead pin may be gold-plated. The lead pin is connected to an electrode pad by reflow, using a support jig.

The lead pin is connected to the electrode pad so as to stand upright on the surface of the wiring board. However, when connecting the lead pin to the electrode pad, the lead pin may be connected in a state tilted from the upright position, or the lead pin may be connected in a deformed state. Further, the lead pin may be connected in a deformed state tilted from the upright position.

Hence, after the lead pin is connected to the electrode pad, a visual inspection apparatus is used to visually inspect whether an abnormality exists in the connection state of the lead pin. In this visual inspection, visible light is irradiated from a direction perpendicular to the surface of the wiring board, and a judgment is made to determine whether the connection state of the lead pin is satisfactory, based on reflected light from the lead pin and a conductive material used for the connection.

However, among the wiring boards having the lead pin that is judged as being defective by the visual inspection apparatus, the lead pins of some of the wiring boards may actually be all satisfactory as a product. In other words, it is difficult to perform the visual inspection with a sufficiently high accuracy.

Examples of the related art include Japanese Laid-Open Patent Publication No. 2009-076853 (now Japanese Patent No. 4309948), Japanese Laid-Open Patent Publication No. 2001-358277 (now Japanese Patent No. 3550355), and Japanese Laid-Open Patent Publication No. H02-34798, for example.

SUMMARY

Accordingly, it is an object in one aspect of the embodiments to provide a lead pin, and a wiring board having the lead pin, that can improve the accuracy of the visual inspection.

According to one aspect of the embodiments, a lead pin includes a shaft portion; a head portion formed on one end of the shaft portion, and having a diameter greater than a diameter of the shaft portion; a tin-based first plated layer exposed at a surface of the head portion visible from the other end of the shaft portion; and a second plated layer exposed at an end surface of the shaft portion visible from the other end of the shaft portion, wherein the second plated layer has a reflectivity with respect to visible light and a conductivity higher than a reflectivity with respect to the visible light and a conductivity of the first plated layer, respectively.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 8A, FIG. 8B, and FIG. 8C are cross sectional views for explaining a method of manufacturing the lead pin of the wiring board having the lead pin according to the first embodiment.

DESCRIPTION OF EMBODIMENTS

Figure 1A:
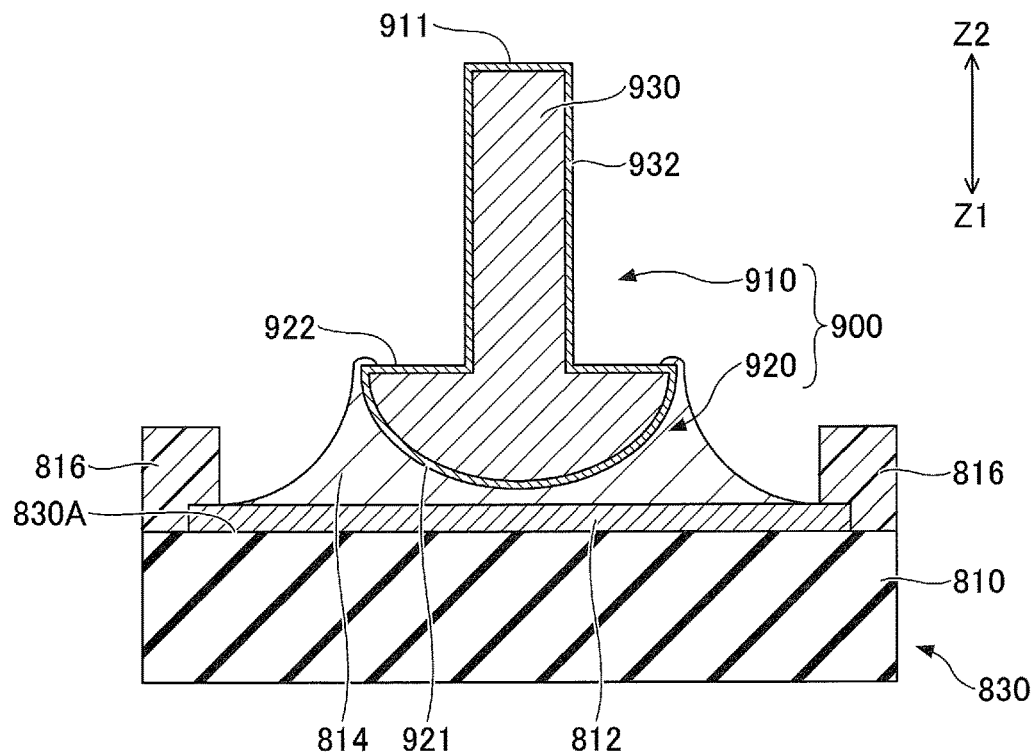
FIG. 1A and FIG. 1B are diagrams illustrating vicinities of a lead pin and an electrode pad of a wiring board having the lead pin according to a reference example.

Preferred embodiments of the present invention will be described with reference to the accompanying drawings. In the drawings, those parts that are the same are designated by the same reference numerals, and a repeated description of the same parts may be omitted. In this specification, a side on which a head portion of a shaft portion is provided will be referred to as a Z1-side, and an opposite side of the shaft portion will be referred to as a Z2-side. An axial direction of the shaft portion will be referred to as a Z1-Z2 direction. However, a lead pin and a wiring board having the lead pin may be used in an up-side down state, or may be arranged at an arbitrary angle.

Inspection Using Visual Inspection Apparatus

Figure 1B:
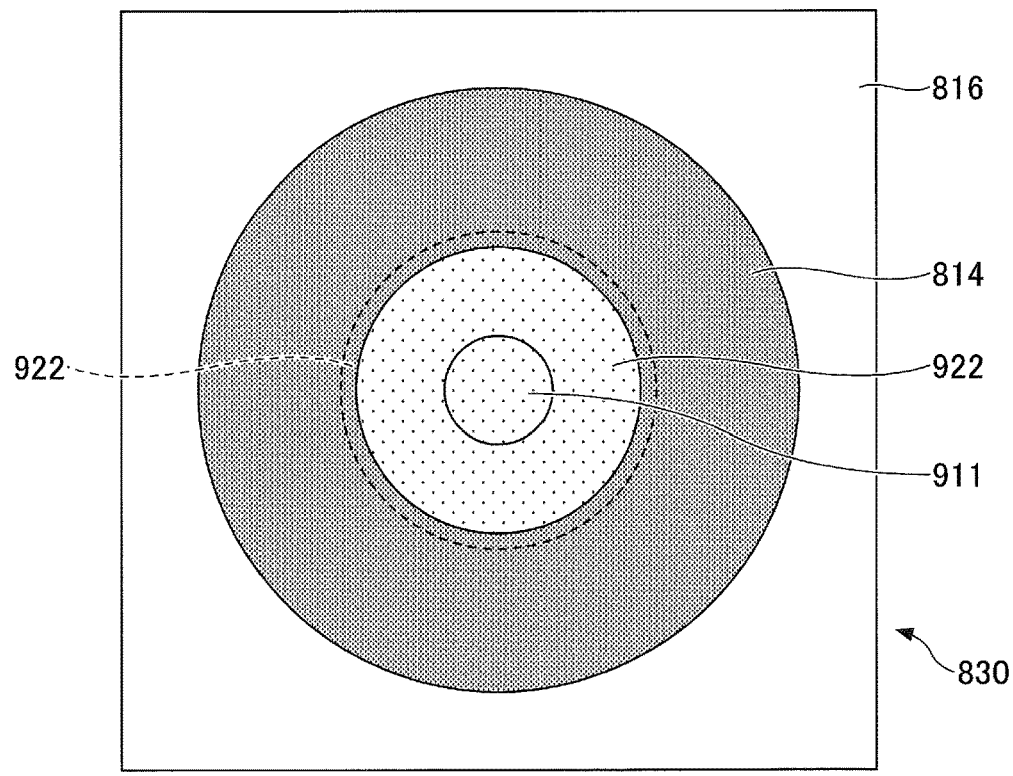
Figure 2A:
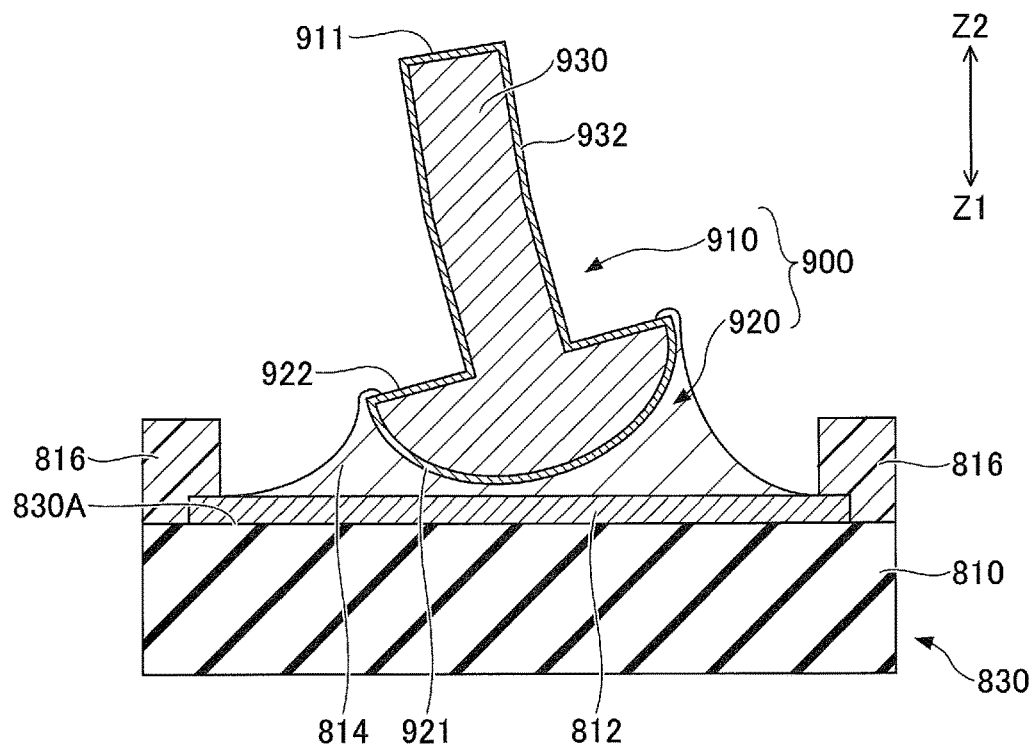
FIG. 2A and FIG. 2B are diagrams illustrating the vicinities of the lead pin and the electrode pad of the wiring board having the lead pin according to the reference example.
Figure 2B:
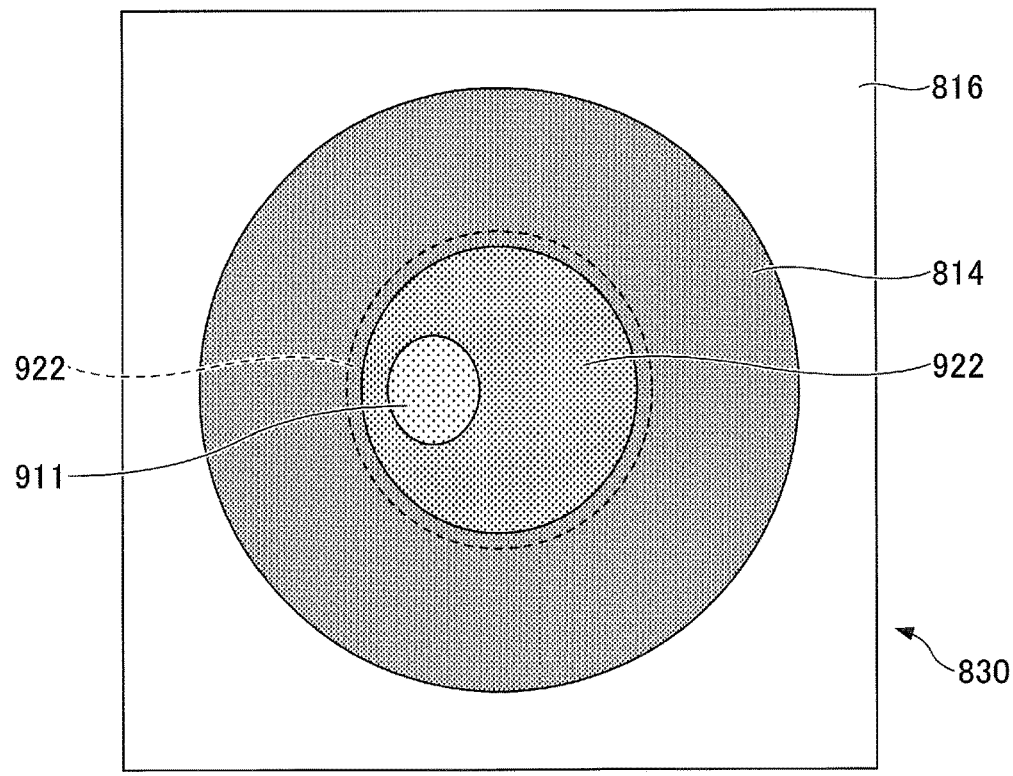
Figure 3A:
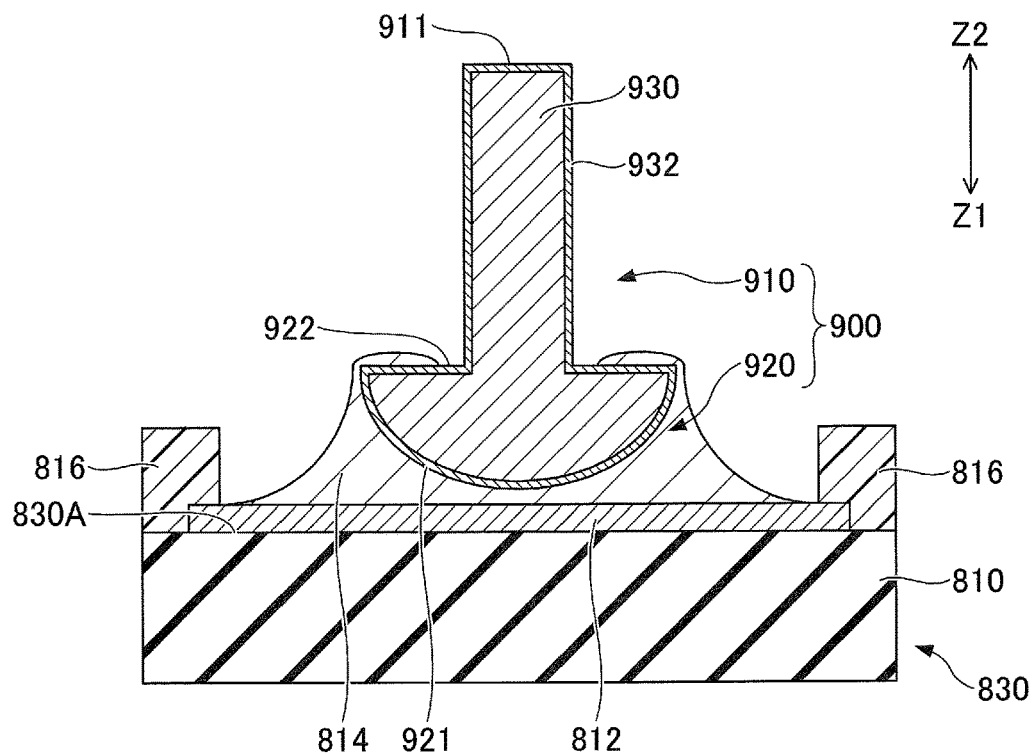
FIG. 3A and FIG. 3B are diagrams illustrating the vicinities of the lead pin and the electrode pad of the wiring board having the lead pin according to the reference example.
Figure 3B:
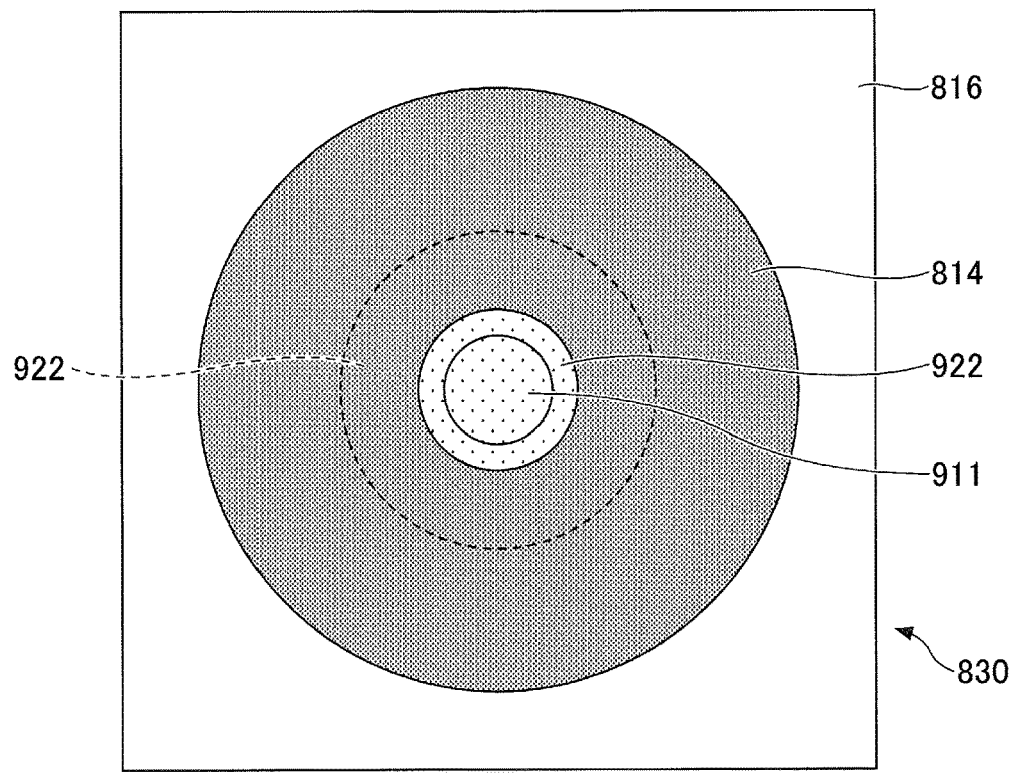

First, an outline of the inspection using a visual inspection apparatus will be described, by referring to a wiring board having a lead pin according a reference example. FIG. 1A through FIG. 3B are diagrams illustrating vicinities of the lead pin and an electrode pad of the wiring board having the lead pin according to the reference example. FIG. 1A, FIG. 2A, and FIG. 3A are cross sectional views, and FIG. 1B, FIG. 2B, and FIG. 3B are observation examples of the inspection using the visual inspection apparatus. FIG. 1A and FIG. 1B illustrate an example of a desirable state. FIG. 2A and FIG. 2B illustrate an example of a defective state. FIG. 3A and FIG. 3B illustrate an example of a state where a conductive material creeps up more than the desirable state illustrated in FIG. 1A and FIG. 1B. In FIG. 1B, FIG. 2B, and FIG. 3B, a darkness of a dot pattern reflects a brightness. In other words, the coarser the dot pattern becomes, the brighter the indicated brightness becomes, and the finer the dot pattern becomes, the darker the indicated brightness becomes.

A lead pin 900 used in a wiring board 830 having the lead pin according to the reference example, includes a shaft portion 910, and a head portion 920 provided on one end of the shaft portion 910. The head portion 920 has a semispherical shape including a spherical surface 921, and a flat surface 922, for example. The spherical surface 921 is positioned on the Z1-side, and the flat surface 922 is positioned on the Z2-side. The lead pin 900 includes a copper-based body 930, and a plated layer 932 formed on the entire surface of the body 930. The plated layer 932 may be a gold-plated layer, or a plated layer laminate of a nickel-plated layer and a gold-plated layer that are laminated in this order.

The wiring board 830 having the lead pin according to this reference example includes a wiring board 810 provided with an electrode pad 812, and a protection layer 816 is formed in a periphery of the electrode pad 812. The head portion 920 is connected to the electrode pad 812 by a conductive material 814 made of a tin-based solder.

As illustrated in FIG. 1A, in the desirable state, the shaft portion 910 stands upright on a surface 830A where the electrode pad 812 of the wiring board 810 is provided, and the conductive material 814 is solidified in a state where wetting and spreading of the conductive material 814 reaches to an edge of the flat surface 922.

In the inspection using the visual inspection apparatus, visible light is irradiated from a direction perpendicular to the surface 830A of the wiring board 830 having the lead pin, and reflected light from the lead pin 900 and the conductive material 814 is acquired immediately above the lead pin 900 and the conductive material 814, to perform an image processing. A reflectivity of gold with respect to the visible light is higher than a reflectivity of the tin-based solder with respect to the visible light. For this reason, when the connection state of the lead pin 900 in the desirable state illustrated in FIG. 1A is inspected, an end surface 911 on the Z2-side of the shaft portion 910 and the flat surface 922 are observed as being brighter than the conductive material 814, as illustrated in FIG. 1B.

When the shaft portion 910 is bent as illustrated in FIG. 2A, the head portion 920 tilts, and the flat surface 922 becomes non-parallel to the surface 830A. In this case, the reflected light from the end surface 911 and the reflected light from the flat surface 922 travel toward a direction inclined from the Z1-Z2 direction. In addition, as illustrated in FIG. 2B, from the Z2-side, the end surface 911 and the flat surface 922 appear smaller than in the desirable state illustrated in FIG. 1B. Accordingly, compared to the desirable state illustrated in FIG. 1B, a region that is observed as being bright decreases, and a region that is observed as being dark increases, in the state illustrated in FIG. 2B.

In the inspection using the visual inspection apparatus, a reference value is preset to an observed brightness, so that it is possible to judge whether the wiring board 830 having the lead pin is satisfactory or is defective, according to a proportion of the region brighter than the reference value to the region darker than the reference value. In other words, it is possible to judge the desirable state illustrated in FIG. 1A and FIG. 1B as being the satisfactory state of the wiring board 830 having the lead pin, and the state illustrated in FIG. 2A and FIG. 2B as being the defective state of the wiring board 830 having the lead pin.

However, according to this inspection method, when a large amount of the conductive material 814 creeps up onto the flat surface 922 as illustrated in FIG. 3A, the wiring board 830 having the lead pin may be judged as being defective, even though the wiring board 830 having the lead pin is satisfactory as a product. In other words, the region that is observed as being dark due to the conductive material 814 that creeps up onto the flat surface 922 increases as illustrated in FIG. 3B, and depending on the extent of the creeping up of the conductive material 814 onto the flat surface 922, the wiring board 830 having the lead pin may be judged as being defective, similar to the state illustrated in FIG. 2B.

When the wiring board having the lead pin is satisfactory as a product but is judged as being defective, the yield deteriorates. A reinspection may be performed by relying on the human eyes or the like to determine whether a wiring board having the lead pin, satisfactory as a product, is included among the wiring boards having the lead pin, judged as being defective. However, it requires a troublesome operation to perform the reinspection.

Accordingly, in the visual inspection using the visual inspection apparatus, it is desirable to judge that the wiring board having the lead pin is satisfactory as a product, even when a relatively large amount of the conductive material creeps up.

First Embodiment

Figure 4:
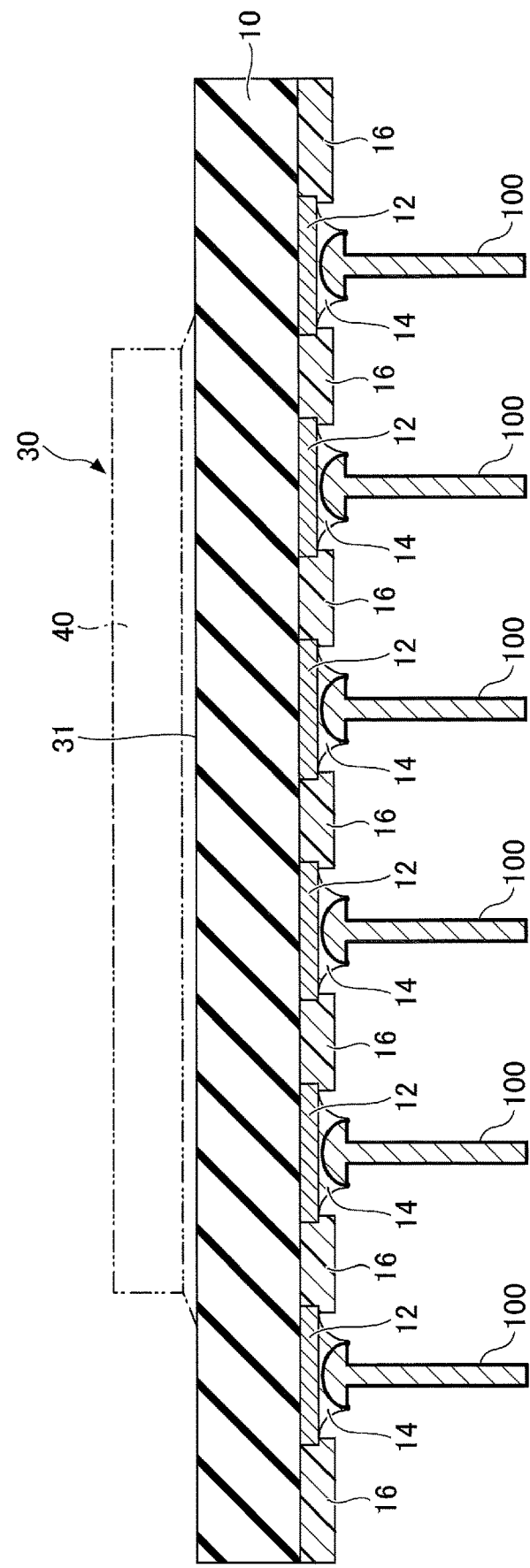
FIG. 4 is a cross sectional view illustrating a wiring board having a lead pin according to a first embodiment.

Next, a first embodiment will be described. The wiring board having the lead pin is described in the first embodiment. FIG. 4 is a cross sectional view illustrating the wiring board having the lead pin according to the first embodiment.

A wiring board 30 having the lead pin according to the first embodiment includes a wiring board 10 provided with electrode pads 12 on one surface of the wiring board 10, and lead pins 100 connected to the corresponding electrode pads 12. The lead pin 100 is connected to the electrode pad 12 by a tin-based conductive material 14. The conductive material 14 is a tin-based solder including tin, such as tin-antimony alloys or the like, for example. A mounting section 31 on which a semiconductor device 40 is mounted, is provided on the other surface of the wiring board 10. Contact pads and predetermined interconnect patterns, to be electrically connected to the semiconductor device 40, are formed in the mounting section 31.

The surface of the wiring board 10 provided with the electrode pads 12 is covered by a protection layer 16 made of a solder resist or the like, and the protection layer 16 exposes the electrode pads 12 to which the lead pins 100 are connected, in a circular planar shape. The electrode pads 12 are formed by a copper layer, for example, and a nickel plating and a gold plating are provided in this order on the surface of the copper layer, as a protection plating.

Figure 5:
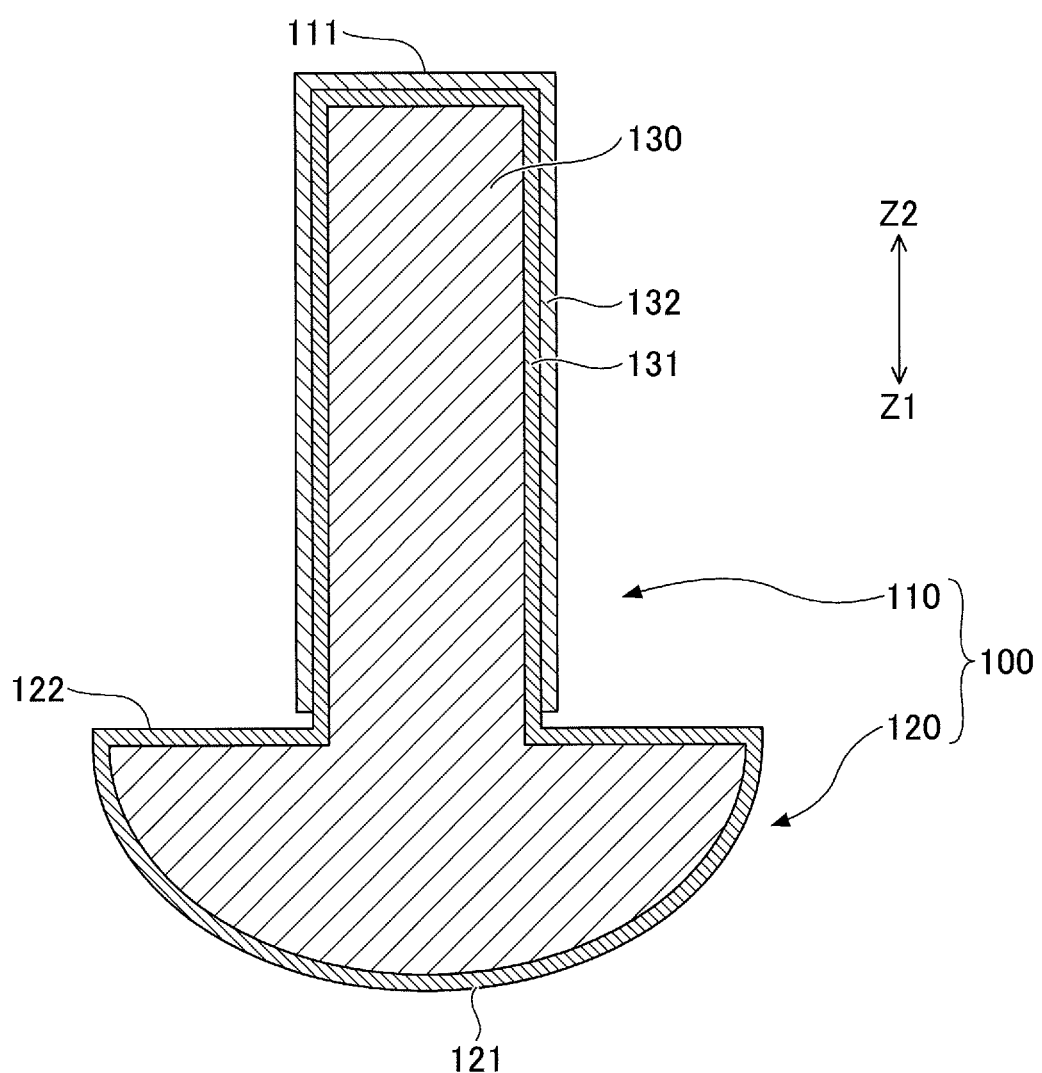
FIG. 5 is a cross sectional view illustrating the lead pin used for the wiring board having the lead pin according to the first embodiment.

The lead pin 100 will be described. FIG. 5 is a cross sectional view illustrating the lead pin 100.

The lead pin 100 includes a shaft portion 110, and a head portion 120 provided on one end on the Z1-side of the shaft portion 110. A maximum diameter of the head portion 120 is greater than a diameter of the shaft portion 110. The head portion 120 has a semispherical shape including a spherical surface 121, and a flat surface 122, for example. The spherical surface 121 is positioned more on the Z1-side than the flat surface 122. Dimensions and shape of the lead pin 100 may be designed as appropriate. As an example, the diameter of the shaft portion 110 is approximately 0.1 mm to approximately 1.5 mm, and the maximum diameter of the head portion 120 is approximately 0.5 mm to approximately 5.0 mm, for example.

The lead pin 100 includes a copper-based body 130, for example. The body 130 has an external shape approximately similar to an external shape of the lead pin 100. A first plated layer 131 is formed on the surface of the body 130. The first plated layer 131 may be a tin-based layer. Examples of the tin-based layer include a tin layer, tin-antimony alloy layer having a melting point of 300° C. or lower, a tin-silver-copper layer (SAC layer) having a melting point of 300° C. or lower, or the like, for example. The first plated layer 131 may include a nickel layer between the tin-based layer and the body 130. Further, in the shaft portion 110, a second plated layer 132 is formed on the first plated layer 131. A reflectivity with respect to the visible light and a conductivity of the second plated layer 132 are higher than a reflectivity with respect to the visible light and a conductivity of the first plated layer 131, respectively. The second plated layer 132 may include a gold layer at an outermost surface thereof, for example. The second plated layer 132 may be the gold layer. The second plated layer 132 may be a plated layer laminate of a tin layer and a gold layer that are laminated in this order on the first plated layer 131. The second plated layer 132 may be a plated layer laminate of a nickel layer, a tin layer, and a gold layer that are laminated in this order on the first plated layer 131. The second plated layer 132 may be a plated layer laminate of a nickel layer and a gold layer that are laminated in this order on the first plated layer 131.

Because the reflectivity with respect to the visible light of the second plated layer 132 is higher than the reflectivity with respect to the visible light of the first plated layer 131, the end surface 111 on the Z2-side of the shaft portion 110 appears brighter than the flat surface 122 when the visible light is irradiated from the Z2-side.

When connecting the lead pin 100 to the electrode pad 12, a conductive paste of a tin-antimony alloy or the like, such as a tin-based solder, for example, is first coated on the exposed surface of the electrode pad 12, as the tin-based conductive material. Then, the head portion 120 of the lead pin 100 is positioned and aligned to each electrode pad 12, and a reflow process is performed. More particularly, a support jig having setting holes for setting the lead pins 100 is prepared, and the setting holes have the same planar arrangement as the electrode pads 12 formed on the wiring board 10. The lead pins 100 are set into the setting holes of the support jig, and the support jig and the wiring board 10 in a state positioned and aligned relative to each other are passed through a reflow apparatus. Hence, it is possible to connect the lead pins 100 to the electrode pads 12, respectively. The support jig is removed after connecting the lead pins 100 to the electrode pads 12, respectively.

Figure 6A:
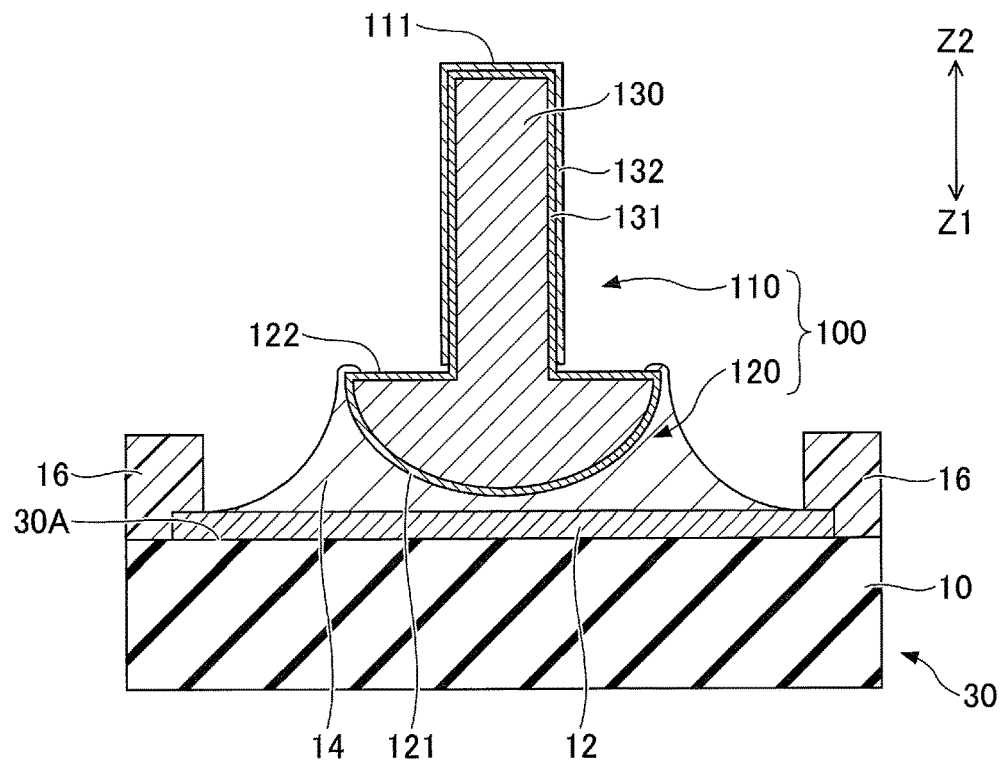
FIG. 6A and FIG. 6B are diagrams illustrating vicinities of the lead pin and an electrode pad of the wiring board having the lead pin according to the first embodiment.
Figure 6B:
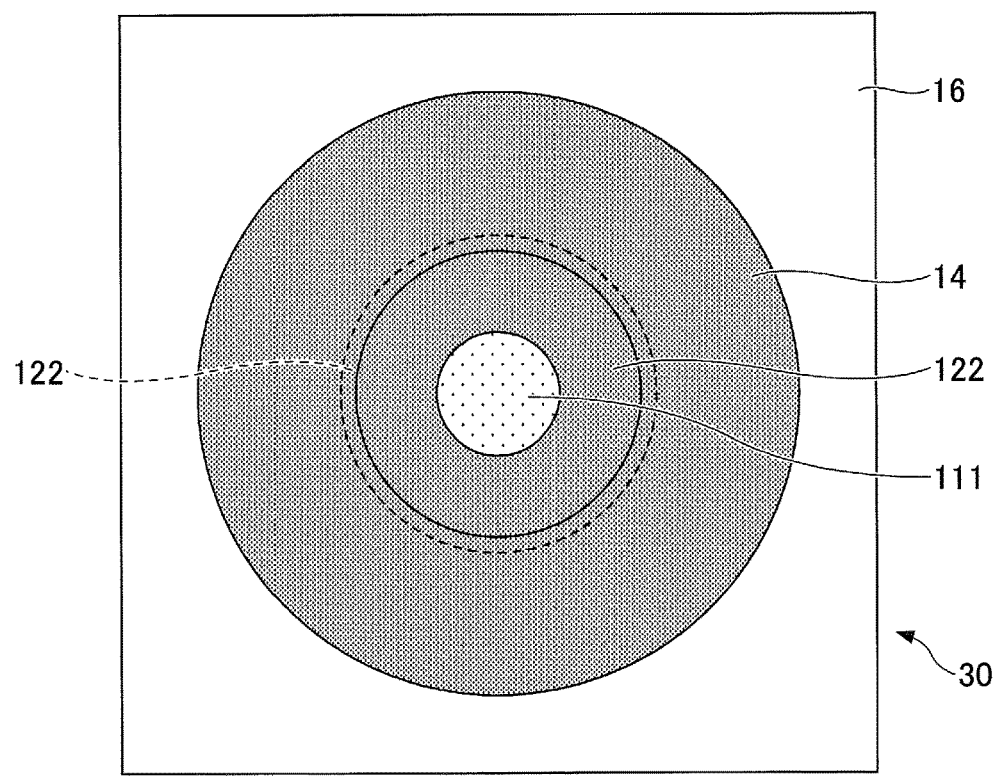
Figure 7A:
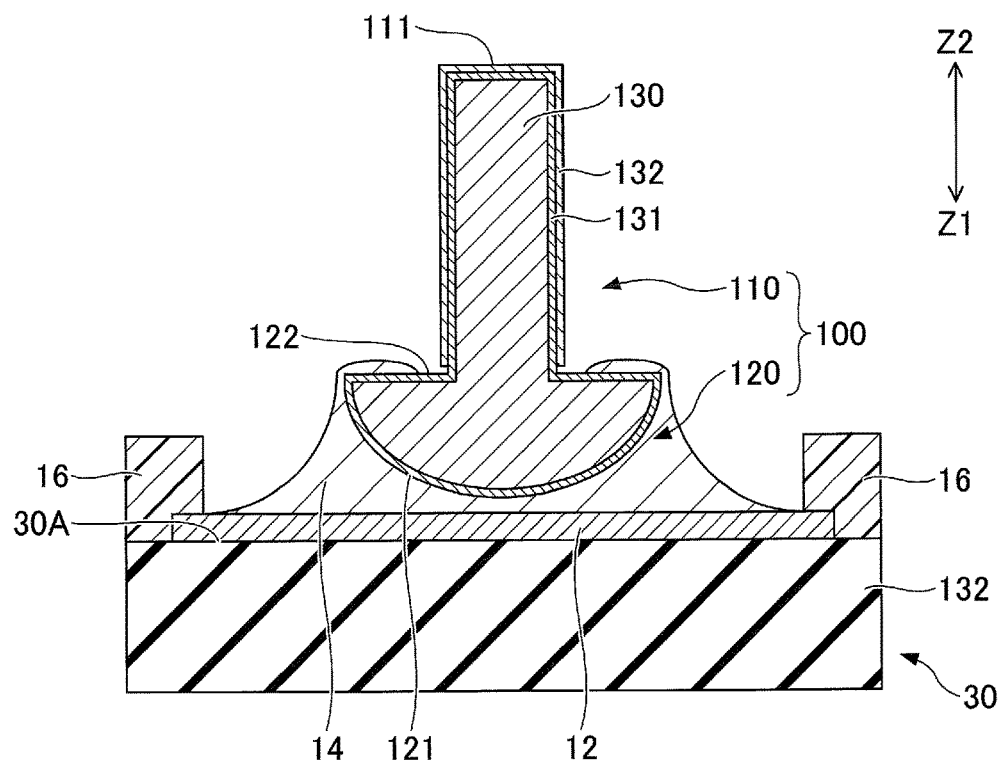
FIG. 7A and FIG. 7B are diagrams illustrating the vicinities of the lead pin and the electrode pad of the wiring board having the lead pin according to the first embodiment.
Figure 7B:
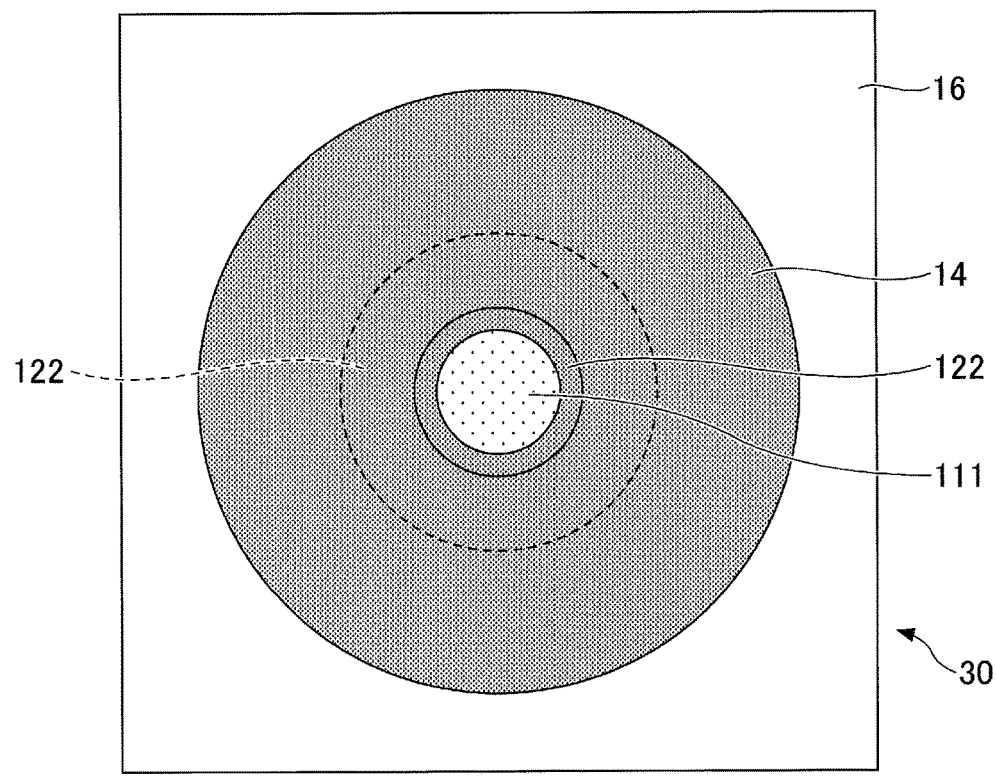

After removing the support jig as described above, the visual inspection apparatus is used to visually inspect whether an abnormality exists in the connected state of the lead pins 100. FIG. 6A through FIG. 7B are diagrams illustrating vicinities of the lead pin and the electrode pad of the wiring board having the lead pin according to the first embodiment. FIG. 6A and FIG. 7A are cross sectional views, and FIG. 6B and FIG. 7B are observation examples of the inspection using the visual inspection apparatus. FIG. 6A and FIG. 6B illustrate an example of a desirable state. FIG. 7A and FIG. 7B illustrate an example of a state where the conductive material creeps up more than the desirable state illustrated in FIG. 6A and FIG. 6B. In FIG. 6B and FIG. 7B, the darkness of the dot pattern reflects the brightness. In other words, the coarser the dot pattern becomes, the brighter the indicated brightness becomes, and the finer the dot pattern becomes, the darker the indicated brightness becomes.

As illustrated in FIG. 6A, in the desirable state, the shaft portion 110 stands upright on a surface 30A where the electrode pad 12 of the wiring board 10 is provided, and the tin-based conductive material 14 is solidified in a state where wetting and spreading of the tin-based conductive material 14 reaches to an edge of the flat surface 122.

Because the reflectivity of gold with respect to the visible light is higher than the reflectivity of the tin-based solder (tin-based conductive material 14) with respect to the visible light, when the connection state of the lead pin 100 in the desirable state illustrated in FIG. 6A is inspected, the end surface 111 on the Z2-side of the shaft portion 110 is observed as being brighter than the flat surface 122 and the tin-based conductive material 14, as illustrated in FIG. 6B.

In addition, when a large amount of the tin-based conductive material 14 creeps up onto the flat surface 122 as illustrated in FIG. 7A, a proportion of the region appearing bright to the region appearing dark when viewed from the Z2-side, as illustrated in FIG. 7B, becomes the same as the proportion of the region appearing bright to the region appearing dark in the desirable state illustrated in FIG. 6B.

Hence, according to the first embodiment, even when the large amount of the tin-based conductive material 14 creeps up onto the flat surface 122, the wiring board 30 having the lead pin can be judged as being satisfactory, that is, judged as being satisfactory as a product.

Further, because the conductivity of the second plated layer 132 is higher than the conductivity of the first plated layer 131, it is possible to reduce a rise in electrical resistance between the wiring board 10 and a mounting board, when mounting the wiring board 30 having the lead pin on the mounting board. Particularly when the outermost surface of the second plated layer 132 is the gold layer, it is possible to secure good conductivity and chemical stability.

When the shaft portion 110 is bent or the head portion 120 is tilted, the end surface 111 becomes non-parallel to the surface 30A, and the proportion of the region appearing bright decreases compared to the proportion of the region appearing bright in the desirable state illustrated in FIG. 6B. Accordingly, it is possible to suitably detect the defective state.

According to the first embodiment, it is thus possible to improve the accuracy of the visual inspection using the visual inspection apparatus.

In addition, the larger the number of the lead pins 100 included in the wiring board 30 having the lead pin becomes, the more inconsistent the extent of the tin-based conductive material 14 that creeps up onto the flat surface 122 becomes. However, although the inconsistency in the extent of the tin-based conductive material 14 that creeps up onto the flat surface 122 is recognizable when observed microscopically, a boundary between the flat surface 122 formed with the tin-based first plated layer 131, and the tin-based conductive material 14, is difficult to recognize when observed macroscopically by the human eyes, and an external appearance viewed from the side of the surface 30A is unlikely to deteriorate.

On the contrary, in the wiring board 830 having the lead pin according to reference example, the boundary between the flat surface 922 formed with the plated layer 932, and the tin-based conductive material 814, is easily recognizable due to the differences in the reflectivities, even when observed macroscopically by the human eyes. For this reason, when the extent of the conductive material 814 that creeps up onto the flat surface 922 is inconsistent, the external appearance viewed from the side of the surface 830A easily deteriorates.

Next, a method of manufacturing the lead pin 100 will be described. FIG. 8A, FIG. 8B, and FIG. 8C are cross sectional views for explaining the method of manufacturing the lead pin 100.

First, as illustrated in FIG. 8A, a long wire having the same diameter as the shaft portion 110 is formed into the body 130 including the shaft portion 110 and the head portion 120, by crushing a cut end of the wire using a mold while feeding the wire.

Next, as illustrated in FIG. 8B, the first plated layer 131 is famed on the entire surface of the body 130. The first plated layer 131 may be formed by electroplating of tin, for example.

Thereafter, as illustrated in FIG. 8C, the second plated layer 132 is formed on the first plated layer 131, at the end surface 111 and the side surface of the shaft portion 110. The second plated layer 132 may be famed by electroless plating of gold, for example. When forming the second plated layer 132, the shaft portion 110 is dipped into a plating solution while making certain that the head portion 120 does not make contact with the plating solution.

The lead pin 100 can be manufactured by the method described above.

Modification of First Embodiment

Figure 9:
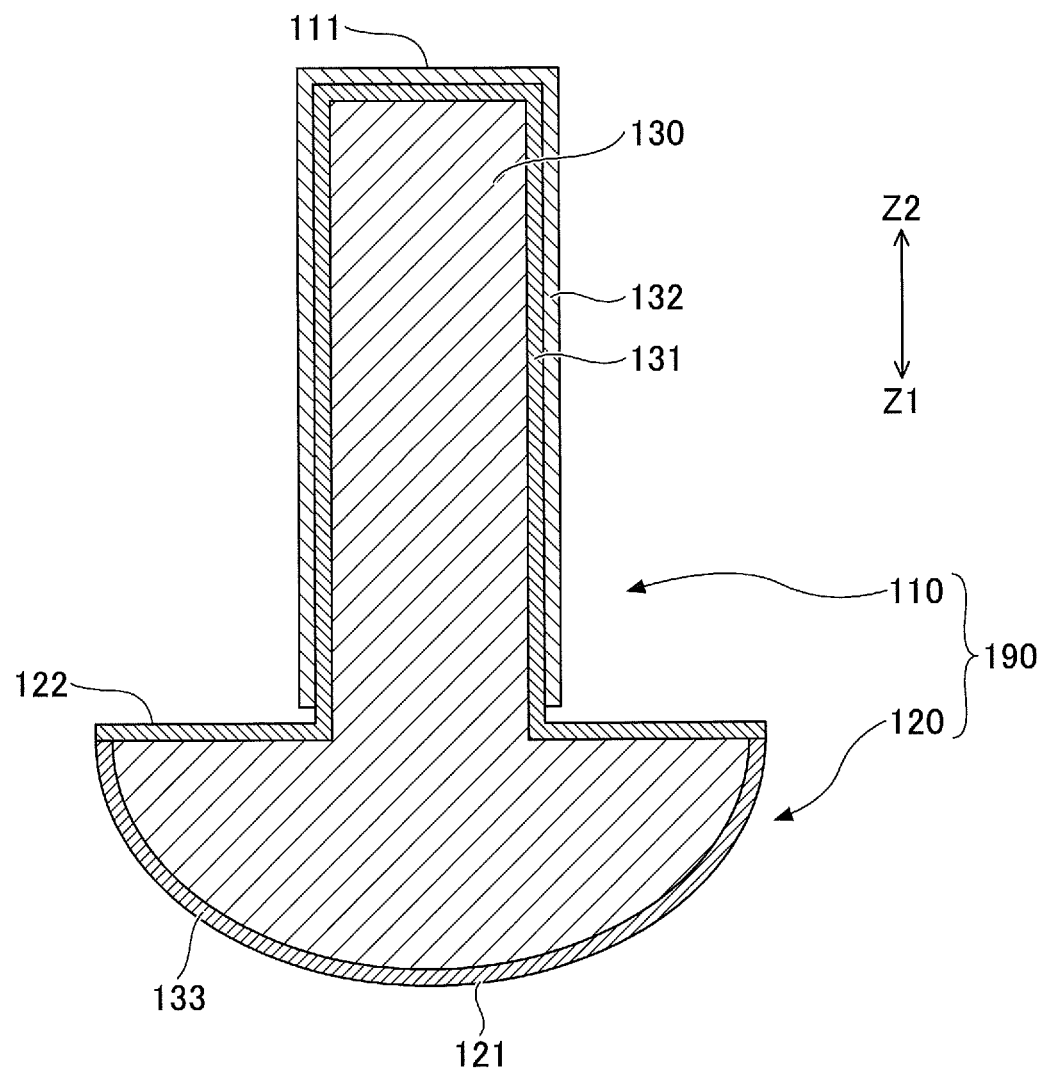
FIG. 9 is a cross sectional view illustrating the lead pin used for the wiring board having the lead pin according to a modification of the first embodiment.

Next, a modification of the first embodiment will be described. FIG. 9 is a cross sectional view illustrating the lead pin used for the wiring board having the lead pin according to the modification of the first embodiment.

The tin-based first plated layer 131 does not need to be exposed at the entire surface of the head portion 120. As in a lead pin 190 according to this modification used for the wiring board having the lead pin, another plated layer 133 may be exposed at the spherical surface 121, as long as the first plated layer 131 is exposed at the flat surface 122. This other plated layer 133 may be a nickel layer, a palladium layer, or the like, for example.

The shape of the head portion 120 does not need to be a strict semi-sphere, and may be a semi-elliptical sphere or the like, for example. The shape of the spherical surface 121 does not need to be a strict semi-sphere, and may be a semi-elliptical sphere or the like, for example. In addition, the head portion 120 may have a disk shape.

Second Embodiment

Figure 10:
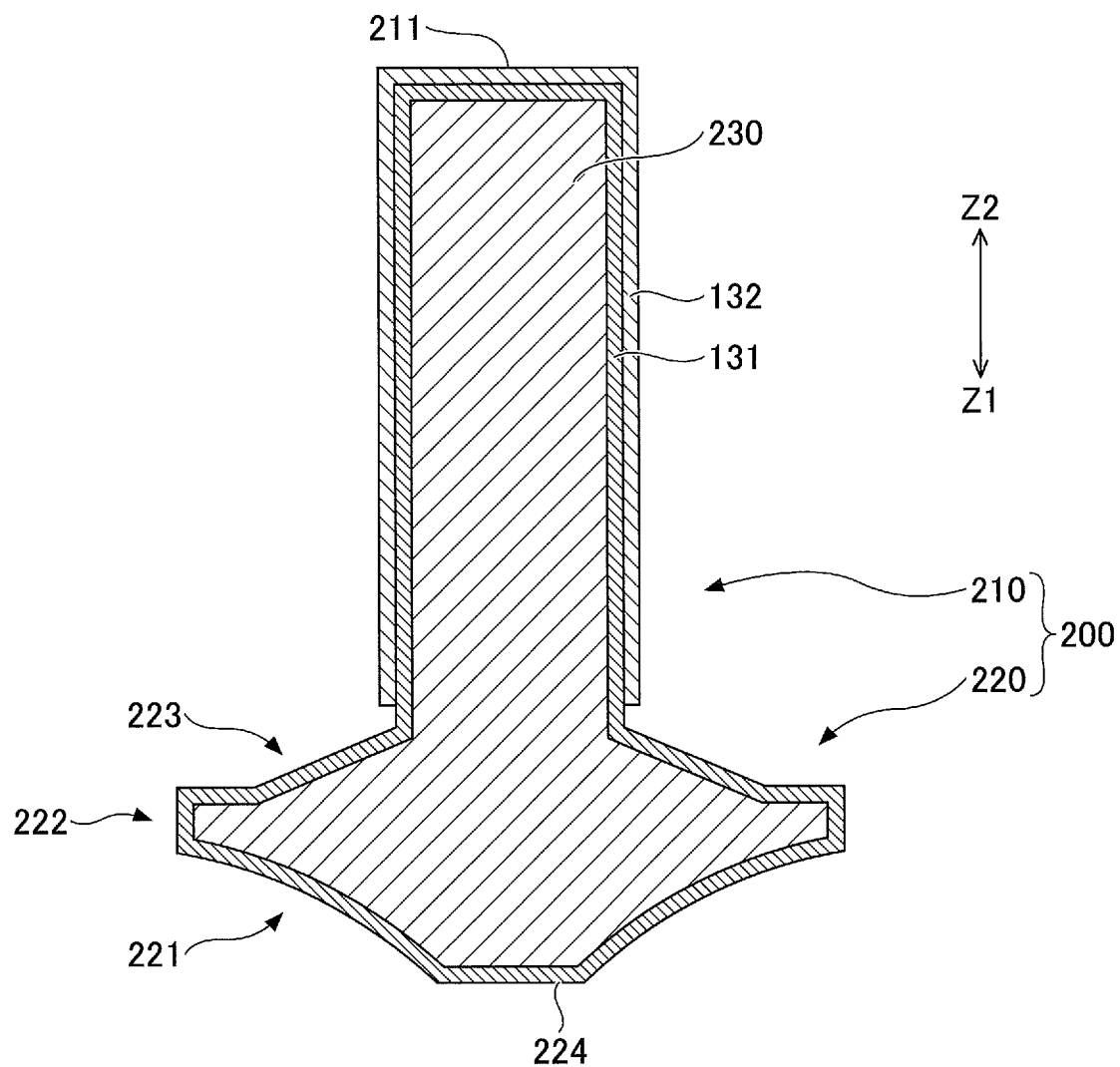
FIG. 10 is a cross sectional view illustrating the lead pin used for the wiring board having the lead pin according to a second embodiment.

Next, a second embodiment will be described. The shape of the head portion of the lead pin according to the second embodiment differs from that of the first embodiment. FIG. 10 is a cross sectional view illustrating the lead pin used for the wiring board having the lead pin according to the second embodiment.

A lead pin 200 used in the wiring board having the lead pin according to the second embodiment includes a shaft portion 210, and a head portion 220 provided on one end on the Z1-side of the shaft portion 210. A maximum diameter of the head portion 220 is greater than a maximum diameter of the shaft portion 210. The head portion 220 includes a truncated cone-shaped projection 221 having a flat surface 224 at a vertex thereof, a flange 222, and a tapered portion 223. The flange 222 is connected to the shaft portion 210, and the flange 222 is positioned on the Z1-side of the tapered portion 223. The truncated cone-shaped projection 221 is positioned on the Z1-side of the flange 222. An outer diameter of the tapered portion 223 is slightly smaller than an outer diameter of the flange 222, at a connecting portion of the tapered portion 223 and the flange 222.

A side surface of the truncated cone-shaped projection 221 is a concave surface. In other words, the side surface (or outer peripheral surface) of the truncated cone of the truncated cone-shaped projection 221 has a concave curved cross section. In this embodiment, a radius of curvature, R, of the side surface (arcuate cross section) of the truncated cone-shaped projection 221 is approximately 1.5 mm.

The lead pin 200 includes a copper-based body 230, for example. The body 230 has an external shape approximately similar to the external shape of the lead pin 200. The first plated layer 131 is formed on the surface of the body 230. Further, the second plated layer 132 is formed on the first plated layer 131 at the shaft portion 210.

Similar to the first embodiment, the reflectivity with respect to the visible light of the second plated layer 132 is higher than the reflectivity with respect to the visible light of the first plated layer 131. For this reason, when the visible light is irradiated from the Z2-side, an end surface 211 on the Z2-side of the shaft portion 210 is observed as being brighter than the surface of the tapered portion 223 on the Z2-side.

Because the vertex of the truncated cone-shaped projection 221 is the flat surface 224 in the lead pin 200, a large contact area can be secured between the lead pin 200 and the electrode pad 12 when contacting and connecting the lead pin 200 to the electrode pad 12. The tapered portion 223 can reinforce the flange 222 and the truncated cone-shaped projection 221. In addition, when connecting the lead pin 200 to the electrode pad 12, the tapered portion 223 can prevent the wetting and spreading of the conductive material 14 from exceeding the flange 222 and reaching the outer peripheral surface of the shaft portion 210.

Moreover, because the side surface of the truncated cone-shaped projection 221 is the concave surface, even when a void is generated in the conductive material 14 between the head portion 220 and the electrode pad 12, the void can easily be ejected outside from the conductive material 14. Consequently, it is possible to reduce tilting of the head portion 220 caused by the void.

In addition, even when a large amount of the conductive material 14 creeps up onto the tapered portion 223, the wiring board having the lead pin can be judged as being satisfactory, that is, judged as being satisfactory as a product. Hence, according to the second embodiment, it is also possible to improve the accuracy of the visual inspection using the visual inspection apparatus.

Modification of Second Embodiment

Figure 11:
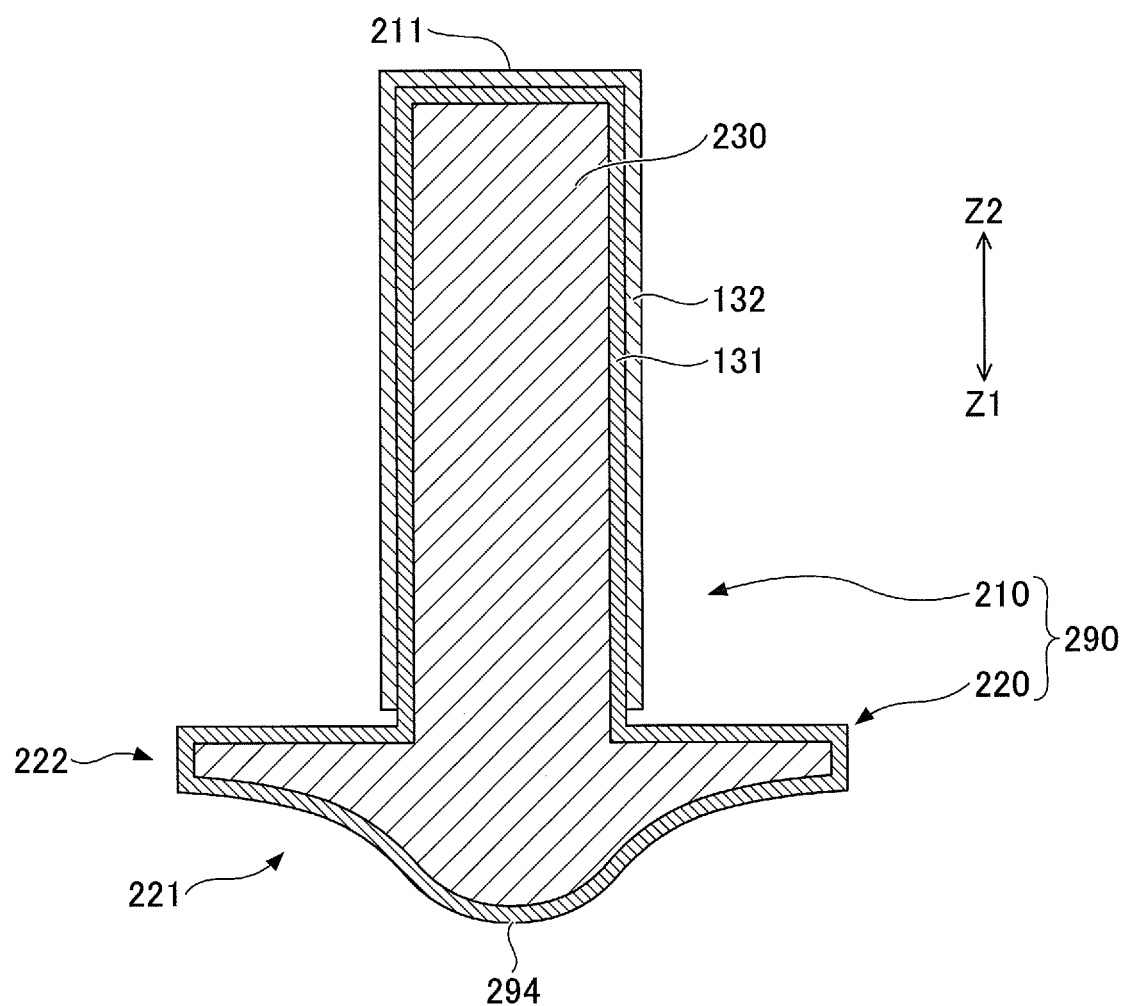
FIG. 11 is a cross sectional view illustrating the lead pin used for the wiring board having the lead pin according to a modification of the second embodiment.

Next, a modification of the second embodiment will be described. FIG. 11 is a cross sectional view illustrating the lead pin used for the wiring board having the lead pin according to the modification of the second embodiment.

A lead pin 290 according to this modification used for the wiring board having the lead pin, differs from the lead pin 200, in that the vertex of the truncated cone-shaped projection 221 in this modification is a rounded surface 294. In addition, no tapered portion 223 is provided, and the shaft portion 210 is directly connected to the flange 222. Otherwise, the configuration of this modification is the same as that of the second embodiment.

This modification can obtain effects similar to the above described effects obtainable in the second embodiment.

Accordingly to each of the embodiments and modifications described above, it is possible to provide a lead pin, and a wiring board having the lead pin, that can improve the accuracy of the visual inspection.

Although the embodiments are numbered with, for example, "first," or "second," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A lead pin comprising:
a shaft having a first end, and a second end opposite to the first end;
a head having a diameter greater than a diameter of the shaft, formed directly on the first end of the shaft, and including a first surface facing a direction toward the second end of the shaft;
a first layer, made of a first metal or alloy material, formed directly on the entirety of both the shaft and the head; and
a second layer, made of a second metal or alloy material, formed on the first layer at the shaft and excluding the head, and exposed at an end surface of the shaft at the second end of the shaft,
wherein the first layer formed at the first surface of the head is exposed to air in a view viewed from the second end toward the first end of the shaft,
wherein the second layer has a reflectivity with respect to visible light higher than a reflectivity with respect to the visible light of the first layer, and
wherein the second layer has a conductivity higher than a conductivity of the first layer.

2. The lead pin as claimed in claim 1, wherein the second layer includes a gold layer at an outermost surface thereof.

3. The lead pin as claimed in claim 2, wherein the second layer covers the first layer at a side surface of the shaft.

4. The lead pin as claimed in claim 3, wherein the first surface of the head is flat.

5. The lead pin as claimed in claim 2, wherein the first surface of the head is flat.

6. The lead pin as claimed in claim 1, wherein the second layer covers the first layer at a side surface of the shaft.

7. The lead pin as claimed in claim 6, wherein the first surface of the head is flat.

8. The lead pin as claimed in claim 1, wherein the first surface of the head is flat.

9. A wiring board having a lead pin, comprising:
a wiring board including an electrode pad; and
the lead pin according to claim 1, electrically connected to the electrode pad by a tin-based conductive material which covers the first layer at the head, excluding a portion of the first layer formed on the first surface of the head,
wherein the tin-based conductive material and the second layer are separate at the head.

10. The wiring board having the lead pin as claimed in claim 9, wherein the second layer includes a gold layer at an outermost surface thereof.

11. The wiring board having the lead pin as claimed in claim 9, wherein the second layer covers the first layer at a side surface of the shaft.

12. The wiring board having the lead pin as claimed in claim 9, wherein the first surface of the head is flat.

13. The wiring board as claimed in claim 9, wherein the end surface of the shaft at the second end of the shaft is flat.

14. The wiring board as claimed in claim 9, wherein the first metal or alloy material is a tin-based alloy material.

15. The wiring board as claimed in claim 9, wherein
the first surface of the head is parallel to the end surface of the shaft portion at the second end of the shaft, and
a surface of the head, not visible in the view viewed from the second end toward the first end of the shaft, includes a curved surface.

16. The lead pin as claimed in claim 1, wherein the end surface of the shaft at the second end of the shaft is flat.

17. The lead pin as claimed in claim 1, wherein the first metal or alloy material is a tin-based alloy material.

18. The lead pin as claimed in claim 1, wherein
the first surface of the head is parallel to the end surface of the shaft at the second end of the shaft, and
a surface of the head, not visible in the view viewed from the second end toward the first end of the shaft, includes a curved surface.

19. The lead pin as claimed in claim 1, wherein the first metal or alloy material is a selected from a group consisting of tin, tin-antimony, and tin-silver-copper.

20. The lead pin as claimed in claim 1, wherein the first layer includes
a nickel layer formed on the shaft and the head of the lead pin, and
a tin-based layer formed on the nickel layer.

* * * * *